United States Patent [19]

Doisy

[11] Patent Number: 5,006,802
[45] Date of Patent: Apr. 9, 1991

[54] MAGNETIC DETECTION METHOD AND DEVICE FOR THE IMPLEMENTATION THEREOF

[75] Inventor: Martine Doisy, Plascassier, France
[73] Assignee: Thomson-CSF, Puteaux, France
[21] Appl. No.: 451,154
[22] Filed: Dec. 15, 1989

[30] Foreign Application Priority Data

Dec. 20, 1988 [FR] France ............................ 88 16804

[51] Int. Cl.⁵ .............................................. G01R 33/26
[52] U.S. Cl. ...................................... 324/304; 324/301
[58] Field of Search .............. 324/300, 301, 304, 316, 324/318, 322

[56] References Cited

U.S. PATENT DOCUMENTS

| | | | |
|---|---|---|---|
| 3,526,002 | 8/1970 | Waddel | 340/4 |
| 3,629,694 | 12/1971 | Hearn | 324/304 |
| 3,646,430 | 2/1972 | Hearn | 324/304 |
| 3,701,005 | 10/1972 | Hartline | 324/301 |
| 3,728,612 | 4/1973 | Hearn et al. | 324/301 |
| 3,786,340 | 1/1974 | Otten et al. | 324/304 |
| 3,828,243 | 8/1974 | Ward | 324/301 |

FOREIGN PATENT DOCUMENTS

| | | |
|---|---|---|
| 140535 | 5/1985 | European Pat. Off. . |
| 224986 | 6/1987 | European Pat. Off. . |
| 246146 | 11/1987 | European Pat. Off. . |

Primary Examiner—Michael J. Tokar
Attorney, Agent, or Firm—Oblon, Spivak, McClelland, Maier & Neustadt

[57] ABSTRACT

In a magnetic field measuring device, conveyed by a carrier vehicle and released from this vehicle in order to be put into action, the excitation means and the measuring means of a nuclear magnetic resonance helium magnetometer are separated. These measuring means are fixed to a body which includes devices for the transmission and exploitation of the measurements given by the measuring means, and this set is released after the exzcitation is completed while the excitation means remain fixed in the carrier vehicle. This makes it possible to fabricate smaller and lighter magnetic localizing buoys.

11 Claims, 1 Drawing Sheet

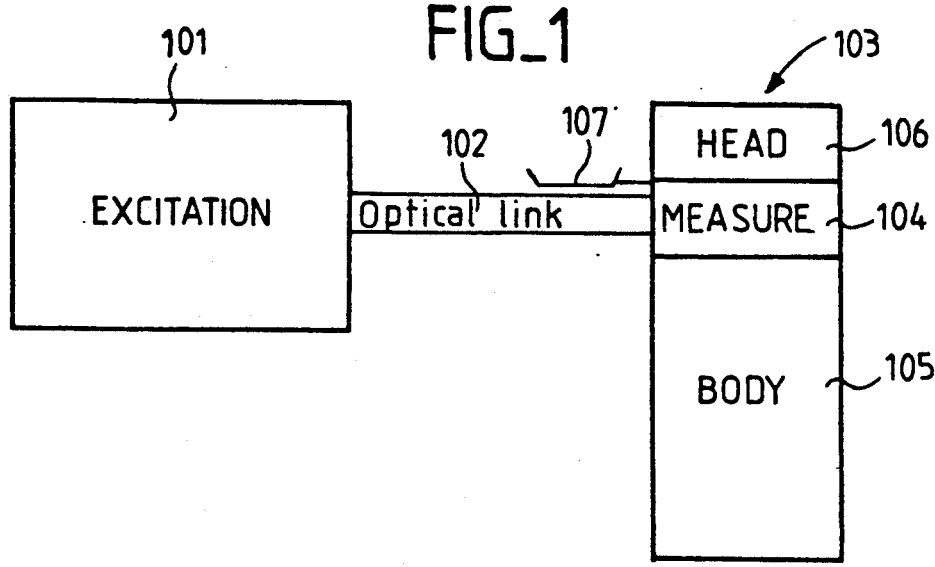
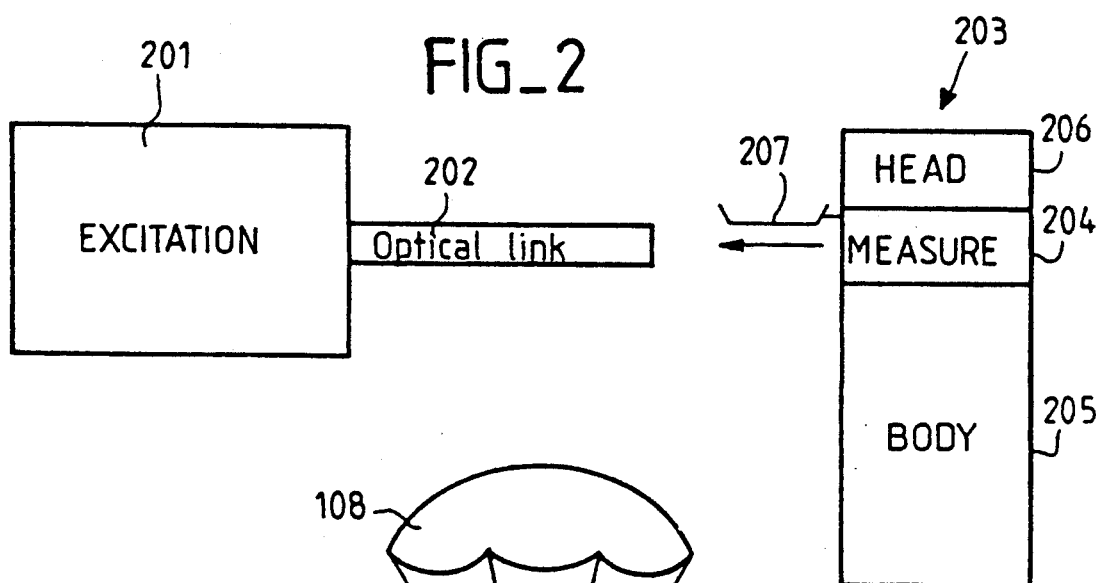
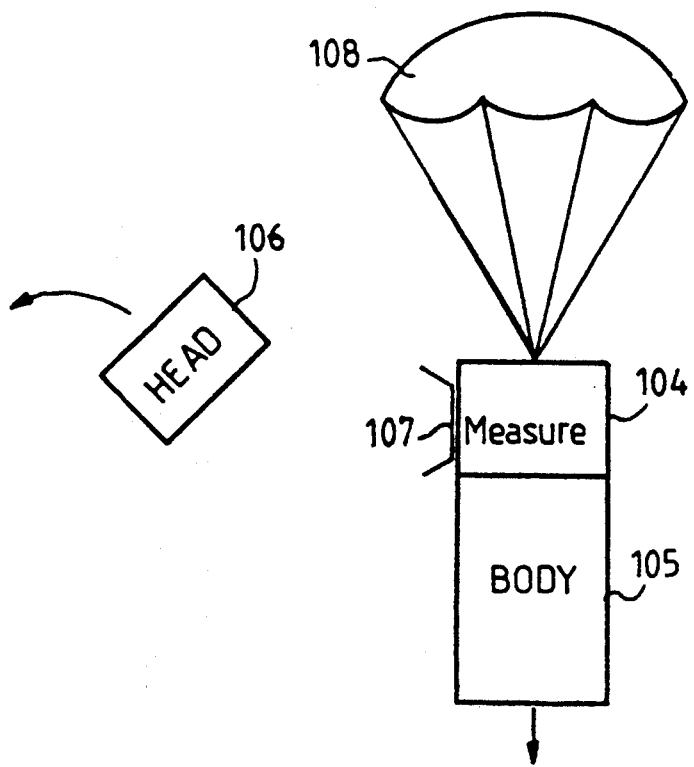

MAGNETIC DETECTION METHOD AND DEVICE FOR THE IMPLEMENTATION THEREOF

BACKGROUND OF THE INVENTION

1. Field of the Invention

The present invention pertains to magnetic detection methods in which buoys are conveyed in a helicopter and dropped into the sea, whereupon they transmit indications from magnetometers contained in them to the helicopter, for example through a radio link. These indications make it possible to determine the presence of submerged masses, such as submarines which modify the earth's magnetic field. The invention also pertains to the buoys and to the devices placed in the helicopter to implement the method, as well as to any device that is released from a carrier vehicle and has a sensitive magnetometer.

2. Description of the Prior Art

Among the most sensitive magnetometers that can be used in devices such as this, there are known magnetic resonance magnetometers working with optically pumped helium cells. The European patent application No. 0 224 986 filed on 4th Aug. 1986 under No. 86305992.9 thus describes a device that comprises two helium$^3$ magnetometers borne at the end of two arms fixed to one end of the device.

The helium$^3$ magnetometers are themselves widely known, for example from the patent application No. 2 104 786 filed on 15th July 1971 as well as the European patent application No. 0 246 146 filed on 7th May 1987 under No. 87401054.9. Fundamentally, these magnetometers have a helium-filled cell which is pumped by different means from the metastable level onwards. Measuring means enable the helium nuclei or atoms to be made to precess, depending on the isotope used, around the magnetic field to be measured, and the measurement of the precession frequency enables value of this magnetic field to be determined.

It is possible to use different pumping means, but one of the most widespread of these means is optical pumping using a substantially monochromatic light source, the wavelength of which is that of the emission of helium used between its metastable level $2^{3s}$ and the excited level $2^{3p}$. The oldest and simplest technique consists in the use of a discharge lamp, which is itself a helium lamp that naturally gives the right wavelength, but it is now possible to use lasers tuned to the right frequency.

The operation takes place in two stages. In a first stage, the measuring cell is excited by means of the pumping stage, and this excitation is stopped when it has reached its maximum effect. In a second stage, the nuclei or atoms of helium are made to precess, and a measurement is made of the corresponding frequency, which determines the value of the magnetic field. It can be noted, quite remarkably, that the nuclear magnetic moments oriented by the optical pumping process preserve this orientation for a relatively long period which may easily go up to ten hours and may exceed 24 hours.

The bulk and weight of the means for the excitation of the helium cell are not inconsiderable in relation to the rest of the measuring apparatus, and they consume a relatively large amount of energy, which requires a power source that is itself bulky and heavy. If it is desired to be able to convey a sufficient number of buoys in a helicopter, the size and the weight of each of these buoys has to be reduced to the maximum extent, and this often leads to limiting the size of the excitation means, and hence the excitation itself. This restricts the sensitivity and duration of the measurements.

SUMMARY OF THE INVENTION

To overcome these drawbacks, the invention proposes the use of excitation means which can be separated from the rest of the magnetometer, so as to keep these excitation means in the carrier vehicle and to release the rest of the magnetometer with the devices, the body of the buoy for example, with which the magnetometer is associated.

BRIEF DESCRIPTION OF THE DRAWINGS

Other particular features and advantages of the invention will appear more clearly in the following description, given as a non-restrictive example and made with reference to the appended drawings, wherein:

FIG. 1 shows a releasable buoy coupled to excitation means; and

FIG. 2 shows the buoy of FIG. 1 after it has been released, and another buoy in the course of being coupled with the excitation means.

DESCRIPTION OF A PREFERRED EMBODIMENT

FIG. 1 shows a device according to the invention when it is placed in a carrier vehicle, a helicopter for example, during the phase for the excitation of the helium cell.

This device has excitation means 101 including, for example, a laser tuned to the appropriate excitation frequency and means for the supply of this laser.

The light energy coming from the excitation means 101 is conveyed by the connection means 102 to a releasable buoy 103. These means could be, for example, a bundle of optic fibers and a collimation optical unit delivering a parallel light beam with appropriate dimensions.

This releasable buoy has a body 105 that may contain various devices, such as hydrophones or an explosive charge for example, a head 106 enclosing releasing means, and a measuring compartment 104 that contains all the parts of a helium magnetometer, except for the means for the excitation of the cell of said magnetometer.

When, in a first step, the cell has been appropriately excited, in a second step, shown schematically in FIG. 2, the excitation means 101 are separated from the measuring compartment 104. This leads to the closing of a shutter 107 which shuts the hole by which the connection means 102 were connected to the compartment 104 and to the using of means, such as an electro-magnet for example, that apply a magnetic field several times more intense than the earth's magnetic field in order to avert shocks during release and to prevent the descent from disorienting the helium atoms. The buoy is then dropped out of the carrier vehicle by causing the head 106 to open. This releases a parachute 108 which unfurls and slows down the descent of the buoy towards the surface of the sea. When the buoy hits this surface, means known per se are used to make it float, on the surface or possibly at a certain depth of submersion. These means, which are activated by the shock on the surface of the water, also cause the stoppage of the means that keep the atoms properly oriented during the descent and, in a known way, they cause the starting of the different circuits, especially the circuits for the measurement of the magnetic fields contained in the compartment 104. The measurements of the magnetic field, as well as possibly other measurements such as acoustic measurements, are then transmitted, here too in a known way, by radio-electrical means towards a reception and interpretation station located, for example, in the carrier vehicle.

After the separation of the buoy from the excitation means, the space has been made free to connect a buoy 203 to these excitation means. This buoy 203 has elements 206 similar to the elements 106 to 107 of the buoy 103. When this buoy 203 is connected to the excitation means, these means may then be put into operation to excite the helium cell of this new buoy which will be then released like the former one.

The process thus described can start again until the stock of buoys contained in the carrier has been exhausted.

The invention has been described within the framework of a helium magnetometer excited by a light energy source, which corresponds to a known technique of optical pumping. It extends to all the devices where it is possible to isolate the excitation system from the cell without causing disturbance in the working of the magnetometer.

In the same way, the invention is not restricted to the case of a passive surveillance buoy release from an aircraft, but can be extended to any device released from a carrier vehicle containing a helium magnetometer.

What is claimed is:

1. A method for the measurement of the magnetic field by means of a helium-type releasable magnetometer, comprising excitation means and measuring means, comprising a helium cell, wherein this helium cell is excited, the excitation means and the measuring means are separated, these measuring means are released to make them go to the place where the measurement has to be made, and a measurement is made of the precession of the helium atoms under the effect of the magnetic field to be measured.

2. A method according to claim 1, wherein the atoms are subjected to an intense magnetic field after the separation step and before the measuring step, to maintain their polarization in spite of the movements of the magnetometer.

3. A method according to claim 2, wherein the excitation of the helium cell is done by optical pumping.

4. Helium type releasable magnetometer comprising excitation means and measuring means capable of being separated from the excitation means, wherein the excitation means are connected to a carrier vehicle and the measuring means can be released from this vehicle.

5. A device according to claim 4, wherein the excitation means deliver a light energy that is substantially monochromatic and wherein they further comprise means to guide this light energy towards the energy means.

6. A device according to claim 5, wherein the guiding means are formed by a bundle of optic fibers.

7. A device according to claim 5, wherein the guiding means are formed by an optical collimation device.

8. A device according to claim 4, comprising a releasable body to which the measuring means are fixed, these measuring means comprising a helium cell and being arranged so that they are capable of applying, to this cell, the excitation coming from the excitation means connected to the carrier vehicle.

9. A device according to claim 8, wherein the measuring means have an opening that makes it possible to let through a light energy from the pumping of the helium cell.

10. A device according to claim 9, further comprising a movable shutter enabling said opening to be closed after the separation of the excitation means and the measuring means.

11. A device according to claim 9, having the shape of a buoy that can be released from an aircraft and enabling the location of the submerged magnetic bodies.

* * * * *